US011031240B2

(12) United States Patent
Zhang et al.

(10) Patent No.: US 11,031,240 B2
(45) Date of Patent: Jun. 8, 2021

(54) METHOD FOR GROWING GALLIUM NITRIDE BASED ON GRAPHENE AND MAGNETRON SPUTTERED ALUMINUM NITRIDE

(71) Applicant: XIDIAN UNIVERSITY, Xi'an (CN)

(72) Inventors: Jincheng Zhang, Xi'an (CN); Jing Ning, Xi'an (CN); Dong Wang, Xi'an (CN); Zhibin Chen, Xi'an (CN); Zhiyu Lin, Xi'an (CN); Yue Hao, Xi'an (CN)

(73) Assignee: Xidian University, Xi'an (CN)

( * ) Notice: Subject to any disclaimer, the term of this patent is extended or adjusted under 35 U.S.C. 154(b) by 299 days.

(21) Appl. No.: 16/083,255

(22) PCT Filed: Sep. 28, 2016

(86) PCT No.: PCT/CN2016/100539
§ 371 (c)(1),
(2) Date: Dec. 18, 2018

(87) PCT Pub. No.: WO2017/152620
PCT Pub. Date: Sep. 14, 2017

(65) Prior Publication Data
US 2019/0108999 A1    Apr. 11, 2019

(30) Foreign Application Priority Data

Mar. 8, 2016 (CN) .......................... 201610129914.7
Mar. 8, 2016 (CN) .......................... 201610130918.7
Mar. 8, 2016 (CN) .......................... 201610130981.0

(51) Int. Cl.
*H01L 21/02*    (2006.01)
*C23C 14/35*    (2006.01)
(Continued)

(52) U.S. Cl.
CPC .... *H01L 21/02444* (2013.01); *C23C 14/0617* (2013.01); *C23C 14/35* (2013.01);
(Continued)

(58) Field of Classification Search
CPC .......... H01L 21/02631; H01L 21/2855; H01L 51/0008; H01L 21/02101; H01L 21/0236;
(Continued)

(56) References Cited

U.S. PATENT DOCUMENTS 9,574,287 B2 * 2/2017 Bayram ............. H01L 21/0254
10,573,517 B2 * 2/2020 Berry .................... C01B 32/184
(Continued)

FOREIGN PATENT DOCUMENTS

| CN | 102769081 A | 11/2012 |
|---|---|---|
| CN | 104465916 A | 3/2015 |

(Continued)

OTHER PUBLICATIONS

Jeong Woo Shon, et al., "Fabrication of full-color InGaN-based light-emitting diodes on amorphous substrates by pulsed sputtering," Scientific Reports, Jun. 23, 2014, vol. 4, Article No. 5325, pp. 1-4.

(Continued)

*Primary Examiner* — Mary A Wilczewski
*Assistant Examiner* — Tsz K Chiu
(74) *Attorney, Agent, or Firm* — Hsuanyeh Law Group PC

(57) ABSTRACT

The present invention discloses a method for growing gallium nitride based on graphene and magnetron sputtered aluminum nitride, and a gallium nitride thin film. The method according to an embodiment comprises: spreading graphene over a substrate; magnetron sputtering an aluminum nitride onto the graphene-coated substrate to obtain a substrate sputtered with aluminum nitride; placing the sub-
(Continued)

strate sputtered with aluminum nitride into a MOCVD reaction chamber and heat treating the substrate to obtain a heat treated substrate; growing an aluminum nitride transition layer on the heat treated substrate and a first and a second gallium nitride layer having different V-III ratios, respectively. The gallium nitrate thin film according to an embodiment comprises the following structures in order from bottom to top: a substrate (1), a graphene layer (2), an aluminum nitride nucleation layer (3) fabricated by using a magnetron sputtering method, an aluminum nitride transition layer (4) grown by MOCVD, and a first and a second gallium nitrate layer (5, 6) having different V-III ratios.

15 Claims, 6 Drawing Sheets

(51) Int. Cl.
*H01L 29/20* (2006.01)
*C30B 25/18* (2006.01)
*C30B 29/40* (2006.01)
*C23C 14/06* (2006.01)
*C23C 16/30* (2006.01)
*C23C 16/02* (2006.01)

(52) U.S. Cl.
CPC ........ *C23C 16/0272* (2013.01); *C23C 16/303* (2013.01); *C30B 25/183* (2013.01); *C30B 29/406* (2013.01); *H01L 21/0242* (2013.01); *H01L 21/0254* (2013.01); *H01L 21/0262* (2013.01); *H01L 21/02381* (2013.01); *H01L 21/02389* (2013.01); *H01L 21/02425* (2013.01); *H01L 21/02458* (2013.01); *H01L 21/02502* (2013.01); *H01L 21/02505* (2013.01); *H01L 21/02631* (2013.01); *H01L 29/2003* (2013.01)

(58) Field of Classification Search
CPC ......... H01L 21/02387; H01L 21/02389; H01L 21/02436; H01L 21/02494; H01L 21/02502; H01L 21/02505; H01L 21/02304; H01L 29/1606; H01L 21/02376; C23C 14/0021–0094; C23C 14/228; C23C 14/34–46; C23C 14/3407–3428; C23C 14/56–568; C01B 32/182–198; C01B 2204/00–32; C01B 21/072–0728; C01B 21/0632

See application file for complete search history.

(56) References Cited

U.S. PATENT DOCUMENTS

| | | |
|---|---|---|
| 2008/0190479 A1 | 8/2008 | Hsieh et al. |
| 2009/0057688 A1 | 3/2009 | Hirayama et al. |
| 2010/0320445 A1* | 12/2010 | Ogihara ............ H01L 21/02612 257/26 |
| 2010/0323164 A1* | 12/2010 | Ogihara .............. H01L 21/2007 428/156 |
| 2011/0049544 A1 | 3/2011 | Komada |
| 2014/0225139 A1* | 8/2014 | Park ..................... H01L 33/483 257/98 |
| 2014/0246399 A1 | 9/2014 | Chiba |
| 2017/0260651 A1* | 9/2017 | Robinson .......... H01L 21/02491 |

FOREIGN PATENT DOCUMENTS

| | | | |
|---|---|---|---|
| CN | 105633225 A * | 6/2016 | ............. H01L 22/94 |
| CN | 105633225 A | 6/2016 | |
| JP | 2009-054782 A | 3/2009 | |
| JP | 2011-009268 A | 1/2011 | |
| JP | 2011-077499 A | 4/2011 | |
| WO | 2013/065601 A1 | 5/2013 | |
| WO | WO 2017/152620 * | 9/2017 | ............. H01L 33/04 |

OTHER PUBLICATIONS

Notification of Reason of Rejection in counterpart Japanese Application and English translation thereof.

* cited by examiner

METHOD FOR GROWING GALLIUM NITRIDE BASED ON GRAPHENE AND MAGNETRON SPUTTERED ALUMINUM NITRIDE

TECHNICAL FIELD

The invention belongs to the field of microelectronics technology, and, more particularly, relates to a method for growing gallium nitride which can be used for fabricating a semiconductor device.

BACKGROUND

The third-generation wide bandgap semiconductor materials, typically including gallium nitride (GaN), have wide applications in the field of optoelectronic devices and electronic devices due to their wide bandgap, high electron mobility and high breakdown field. The growth of high-quality gallium nitride is the key to making microwave power devices. However, due to the large lattice mismatch and thermal mismatch between a gallium nitride material and a substrate, the gallium nitride obtained by heteroepitaxial tends to have very high dislocation density, which greatly limits the performance and reliability of gallium nitride-based devices. Therefore, epitaxial growth of gallium nitride materials with low dislocation density is a key technology in GaN research.

Graphene is a novel two-dimensional material and its mobility is very high. The lattice mismatch between graphene and gallium nitride is no more than 3%. Therefore, it is highly suitable to grow a Group III nitride thereon.

CN102769081A (Chinese Patent Application No.: 201110112819.3) discloses an epitaxial GaN structure using graphene as buffer layer and a preparation method thereof. The method can obtain low stress and high quality GaN epitaxial layer by using a graphene layer as a buffer layer between the substrate and the gallium nitride epitaxial layer, and interposing a thin nitride layer between the graphene layer and the GaN layer to effectively alleviate the problem of lattice mismatch and thermal expansion coefficient mismatch between the substrate and gallium nitride. However, deficiencies of this method are as follows. Firstly, the method uses silicon carbide as the substrate which has too high cost. Secondly, in this method, the graphene is directly grown on the silicon carbide substrate. The growth is difficult and the quality of the graphene is poor. Thirdly, in this method, the thin layer of nitride is directly inserted between the graphene layer and the gallium nitride layer; it is difficult for the thin layer of nitride to nucleate, and the crystal quality is poor, which affects the growth of gallium nitride in the next process.

CN 102201503A (Chinese patent Application No.: 201110078131.8) discloses a method of growing a group III nitride substrate, the substrate and LED. The method comprises the following steps: (1) growing a graphene layer on the surface of a support substrate; (2) epitaxially growing the group III nitride semiconductor layer by MOCVD on the graphene layer; and, in this step, the maximum growth temperature of the group III nitride semiconductor layer is below the melting point of copper. This method has the advantages that the growth process is simple and does not introduce any impurity during the growth. However, deficiencies of this method are as follows. Firstly, since the method comprises epitaxial growing on a copper substrate, the temperature of the subsequently grown nitride material cannot be higher than the melting point of copper. But the suitable growth temperature of aluminum nitride which as common nucleation layer is higher than the melting point. Thus, the better AlN layer cannot be grown in the method and the quality of obtained nitride material is poor. Secondly, the method does not use a transition layer; and the nitride material can only be grown on the substrate with small lattice mismatch.

SUMMARY OF THE INVENTION

An object of the present invention is to overcome the above-mentioned drawbacks of the prior art and to provide a method for growing a gallium nitride by utilizing graphene and magnetron sputtering aluminum nitride technology, to improve the quality of a gallium nitride film.

The invention provides a method for growing gallium nitride, comprising: spreading graphene over a substrate; magnetron sputtering aluminum nitride onto the graphene-coated substrate to obtain a substrate sputtered with aluminum nitride; placing the substrate sputtered with aluminum nitride in a metal organic chemical vapor deposition MOCVD reaction chamber, and heat treating the substrate to obtain the heat-treated substrate; and growing a first gallium nitride layer and a second gallium nitride layer on the heat-treated substrate, respectively. V-III ratio of the first gallium nitride layer is different from V-III ratio of the second gallium nitride layer.

The present invention also provides a gallium nitride film comprising the following structures from bottom to top: a substrate, a graphene layer, an aluminum nitride nucleation layer formed by a magnetron sputtering method, a first gallium nitride layer and a second gallium nitride layer. V-III ratio of the first gallium nitride layer is different from V-III ratio of the second gallium nitride layer.

DETAILED DESCRIPTION

The technical solutions and effects of the present invention will be further described below with reference to the accompanying drawings and embodiments.

First Embodiment

Figure 1:
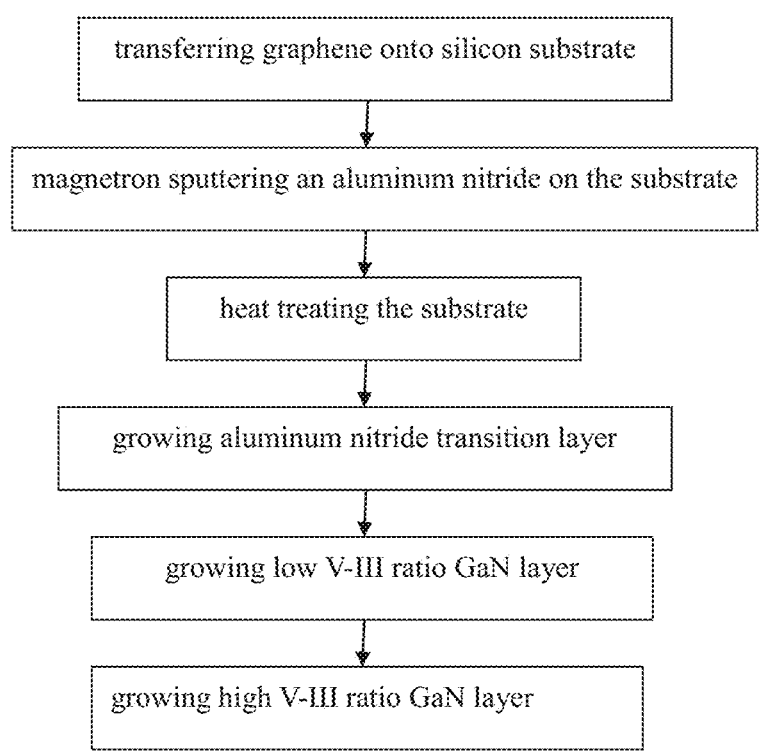
FIG. 1 is a flow chart of a method for fabricating a gallium nitride having a silicon substrate, in accordance with a first embodiment of the present invention.

Referring to FIG. 1, the method of the first embodiment utilizes a silicon substrate and graphene, and forms an aluminum nitride nucleation layer by magnetron sputtering, and uses a pulsed metal organic chemical vapor deposition (MOCVD) method for epitaxial growth of aluminum nitride. Specifically, firstly, a single layer of graphene is transferred onto a silicon substrate; then, a layer of aluminum nitride nucleation layer is magnetron sputtered, which is used for alleviating the stress caused by lattice mismatch between the silicon substrate and the gallium nitride; next, the MOCVD reaction chamber and a pulse method are used for epitaxial growth of a layer of aluminum nitride as a transition layer, to improve the quality of the material; finally, the sample is placed in the MOCVD reaction chamber for sequentially epitaxial growth of the aluminum nitride transition layer, a low V-III ratio GaN epitaxial layer and a high V-III ratio GaN epitaxial layer. The quality of gallium nitride can be further improved by adjusting pressures, flow rates, temperatures and thickness growth conditions during growth of each layer.

The method of this embodiment includes the following steps:

Step 1: Transferring Graphene.

A single layer of graphene having a thickness of 0.34 nm to 34 nm or 1 to 100 carbon atom layers is grown on a metal substrate (such as a copper substrate) by a chemical vapor deposition method; and then the single layer of graphene is placed in a mixed solution of 1 M chlorination iron and 2M hydrochloric acid for 12 hours; finally, after removing the metal substrate, the single layer of graphene is transferred onto a silicon substrate to obtain a graphene-coated silicon substrate. The silicon substrate may be silicon substrates of different crystal orientations such as (100) and (111).

According to the method of this embodiment, the graphene is transferred onto the silicon substrate, and then the growth is performed, so as to overcome the deficiencies of the prior art that the temperature of the subsequently grown nitride material cannot be higher than the melting point of the copper and the quality of the nitride material is accordingly affected, and to cause the embodiment to have the advantage that the upper limit of growth temperature of the nitride material is determined by the substrate, improving the quality of the nitride material.

Step 2: Magnetron Sputtering Aluminum Nitride.

The graphene-coated silicon substrate is placed in a magnetron sputtering system which a pressure of the reaction chamber is 1 Pa; and nitrogen gas and argon gas are introduced for 5 minutes. An aluminum nitride having a thickness of 30-100 nm (e.g., 30 nm) is sputtered on the graphene-coated silicon substrate by using RF magnetron sputtering process with 5N purity aluminum as a target material, to obtain a substrate sputtered with aluminum nitride. The flow rate of ammonia gas is 1000 sccm; and the flow rate of aluminum source is 5-100 μmol/min.

According to the method of this embodiment, the magnetron sputtering method is used to grow aluminum nitride, so as to overcome the deficiency of the prior art that the nitride material is nucleated with difficultly on the graphene, and to cause the embodiment to have the advantage that the nitride material is easily nucleated on the graphene. In addition, since the temperature required for the magnetron sputtering method is low, so as to avoid thermal decomposition of graphene at high temperatures.

Step 3: Heat Treating.

The substrate sputtered with aluminum nitride is placed in a metal organic chemical vapor deposition (MOCVD) reaction chamber; and a mixed gas of hydrogen gas and ammonia gas is introduced into the reaction chamber for 5 minutes. After the mixed gas of hydrogen gas and ammonia gas is introduced for 5 minutes, the reaction chamber is heated to 600° C., and the substrate sputtered with aluminum nitride is heat-treated for 20 minutes, to obtain a heat treated substrate.

Step 4: Growing an Aluminum Nitride Transition Layer.

The pressure of the reaction chamber is maintained at 40 Torr; the temperature is raised to 650° C.; hydrogen gas, ammonia gas and aluminum source are sequentially introduced therein; and an aluminum nitride buffer layer having a thickness of, for example, 7 nm is grown at a low temperature. Under the atmosphere of hydrogen gas, ammonia gas and aluminum source, the temperature is raised to 1050° C.; and an aluminum nitride transition layer having a thickness of, for example, 80 nm to 200 nm is grown by using a pulsed MOCVD growth method, to obtain an aluminum nitride substrate. The pulsed MOCVD growth method includes: during one pulse period T1+T2 of growing aluminum nitride, introducing ammonia gas in the T1 time, and not introducing the ammonia gas in the T2 time; the T1 time is set to 12 s, the T2 time is set to 6 s, and such pulse period is repeated 200 times; the flow rate of aluminum source is 5-100 μmol/min (e.g., 10 μmol/min); and the flow rate of ammonia gas is 800-1500 sccm (e.g., 1000 sccm).

The aluminum nitride is grown by using the pulse method in the embodiment, so as to overcome the deficiency of prior art that aluminum nitride is grown with large dislocation density and poor quality, and to easily obtain high quality aluminum nitride insertion layer.

Step 5: Growing a Low V-III Ratio Gallium Nitride Layer.

The pressure of the reaction chamber is reduced to 20 Torr; the temperature is lowered to 1000° C.; and hydrogen gas, ammonia gas and gallium source are sequentially introduced therein. Under the atmosphere of hydrogen, ammonia and gallium source, a gallium nitride epitaxial layer having a thickness of 50-200 nm (e.g., 100 nm) is grown on the aluminum nitride substrate by using the chemical vapor deposition method, to obtain a low V-III ratio gallium nitride substrate. The flow rate of gallium source is 10-200 μmol/min (e.g., 120 μmol/min); the flow rate of ammonia gas is 1000-3500 sccm (e.g., 3000 sccm).

Step 6: Growing a High V-III Ratio Gallium Nitride Layer.

The temperature of the reaction chamber is maintained at 1000° C.; the pressure is increased to 40 Torr; and then hydrogen gas, ammonia gas and gallium source are sequentially introduced therein. Under the atmosphere of hydrogen gas, ammonia gas and gallium source, a gallium nitride epitaxial layer having a thickness of 500-3000 nm (e.g., 1500 nm) is grown on the low V-III ratio gallium nitride substrate by using chemical vapor deposition method. The flow rate of gallium source is 10-200 μmol/min (e.g., 120 μmol/min); and the flow rate of ammonia gas is 4000-10000 sccm (e.g., 5000 sccm). Then, after the temperature of the reaction chamber is reduced to the room temperature, the sample is taken out, to obtain c-plane gallium nitride.

The order of the above steps 5 and 6 may be reversed.

Figure 2:
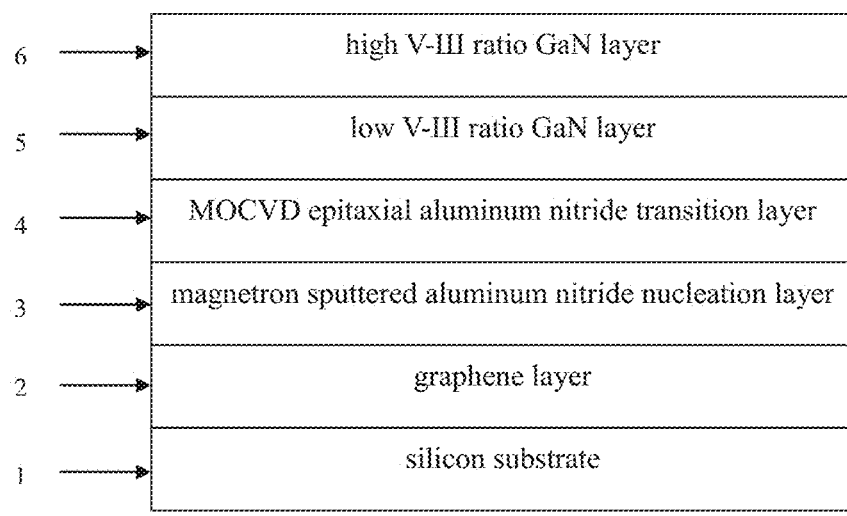
FIG. 2 is a schematic cross-sectional structural view of the silicon-based gallium nitride fabricated by the method of the first embodiment.

FIG. 2 shows a cross-sectional structure of the silicon-based GaN based on graphene and magnetron sputtered aluminum nitride, which is fabricated by the above method of this embodiment. In the silicon-based GaN, in order from bottom to top, a silicon substrate layer 1, a graphene layer 2, a magnetron sputtered aluminum nitride nucleation layer 3, an aluminum nitride transition layer 4, a low V-III ratio GaN layer 5, and a high V-III ratio GaN layer 6 are formed. In another optional cross-sectional structure, in order from bottom to top, a silicon substrate layer, a graphene layer, a magnetron sputtered aluminum nitride nucleation layer, an aluminum nitride transition layer, and a high V-III ratio GaN layer and a low V-III ratio GaN layer are formed.

Second Embodiment

The method of the second embodiment utilizes a sapphire substrate. In the method of the second embodiment, firstly, a single layer of graphene is transferred onto the sapphire substrate, such that the temperature of the subsequently grown nitride material depends on the temperature of the sapphire substrate; then, a layer of aluminum nitride film is magnetron sputtered, which is used for alleviating the stress caused by lattice mismatch between the substrate and the gallium nitride; next, a layer of aluminum nitride film is epitaxially grown as a transition layer by using MOCVD method, to improve the quality of the material; finally, the sample is placed in MOCVD reaction chamber; and sequentially, the aluminum nitride transition layer, the low V-III ratio GaN epitaxial layer and the high V-III ratio GaN epitaxial layer are epitaxially grown. The quality of gallium nitride can be further improved by adjusting the pressure, flow rate, temperature and thickness growth conditions during growth of each layer.

Figure 3:
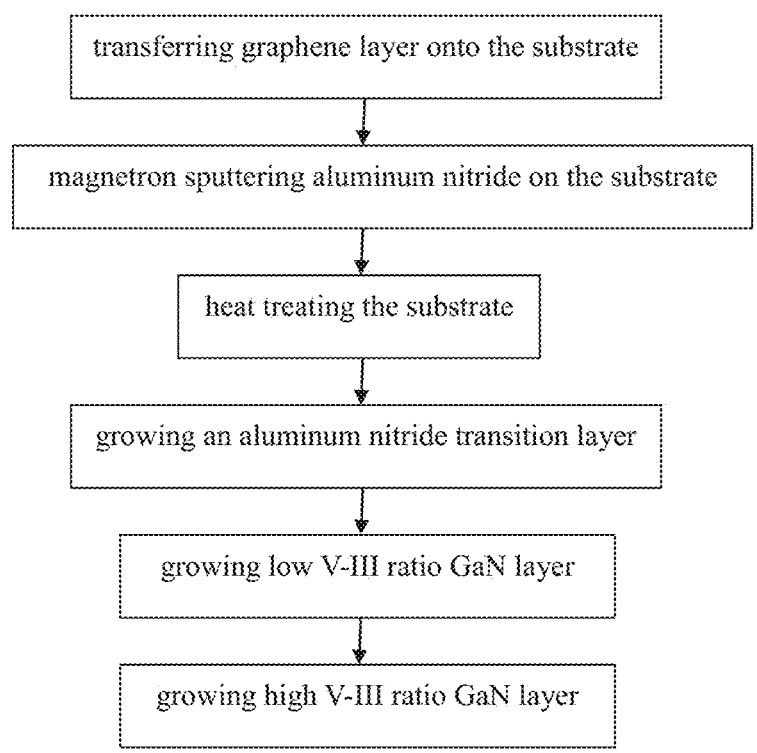
FIG. 3 is a flow chart of a method for fabricating a gallium nitride having a sapphire substrate, in accordance with a second embodiment of the present invention.

Referring to FIG. 3, the method of this embodiment includes the follow steps.

Step 1. Transferring Graphene.

Firstly, a single layer of graphene having a thickness of, for example, 0.34 nm is grown on a metal substrate, such as a copper substrate, by using chemical vapor deposition method. Then the single layer of graphene is placed in a mixed solution of 1M ferric chloride and 2M hydrochloric acid for 12 hours. Finally, after removing the metal substrate, the single layer of graphene is transferred onto the sapphire substrate, to obtain a graphene-coated sapphire substrate, so that the temperature of the subsequently grown nitride material depends on that of the sapphire substrate.

According to the method of this embodiment, the graphene is transferred onto the substrate and then the growth is performed, so as to overcome the deficiency of the prior art that the temperature of the subsequently grown nitride material cannot be higher than the melting point of the copper and the quality of the nitride material is accordingly affected, and to cause the method of the embodiment to have the advantage that the upper limit of the growth temperature of the nitride material is determined by the substrate, and the quality of the nitride material is improved.

Step 2. Magnetron Sputtering Aluminum Nitride.

Firstly, the graphene-coated sapphire substrate is placed in a magnetron sputtering system; the pressure of the reaction chamber is 1 Pa; and nitrogen gas and argon gas are introduced therein for 5 minutes. With 5N purity aluminum as target material, the aluminum nitride film having a thickness of 30-100 nm (such as 30 nm or 80 nm) is sputtered on the sapphire substrate covered with graphene by using RF magnetron sputtering technology, which is used for alleviating the stress caused by lattice mismatch between the substrate and the gallium nitride. Thus, a substrate sputtered with aluminum nitride is obtained.

Similar to the first embodiment, the above stated step of magnetron sputtering aluminum nitride causes this embodiment to have the advantage that the nitride material is easily nucleated on the graphene; and since the temperature required for the magnetron sputtering method is very low, thermal decomposition of graphene at high temperature can be avoided.

Step 3. Heat Treating.

Firstly, the substrate sputtered with aluminum nitride is placed in an MOCVD reaction chamber; and a mixed gas of hydrogen gas and ammonia gas is introduced into the reaction chamber for 5 minutes. After the mixed gas of hydrogen gas and ammonia gas is introduced for 5 minutes, the reaction chamber is heated to 600° C., and the substrate sputtered with aluminum nitride is heat-treated for 20 minutes, to obtain a heat-treated substrate.

Step 4. Growing Aluminum Nitride Transition Layer.

The pressure of the reaction chamber is maintained at 40 Torr; the temperature is raised to 1050° C., and hydrogen gas, ammonia gas and aluminum source are sequentially introduced therein. Then, under the atmosphere of hydrogen gas, ammonia gas and an aluminum source, a thickness of 5-50 nm (such as 30 nm) of aluminum nitride, as a transition layer, is grown on the heat-treated substrate by using a chemical vapor deposition method, to improve the quality of the material. Thus, an aluminum nitride substrate is obtained. The flow rate of aluminum source is 5-100 μmol/min (for example, 20 μmol/min); and the flow rate of ammonia gas is 100-5000 sccm (for example, 300 sccm or 3000 sccm).

According the method of this embodiment, the magnetron sputtered aluminum nitride and aluminum nitride transition layer are utilized, so as to solve the problem of prior art that the nitride material can only be grown on a substrate with small lattice mismatch, to cause the gallium nitride to be grown on a substrate with large lattice mismatch, and to further improve the quality of the material.

Step 5. Growing Low V-III Ratio GaN Layer.

The pressure of the reaction chamber is lowered to 20 Torr; the temperature is lowered to 1000° C.; and hydrogen gas, ammonia gas and gallium source are sequentially introduced therein. Then, under the atmosphere of hydrogen gas, ammonia gas and gallium source, a gallium nitride epitaxial layer having a thickness of 50 to 200 nm (e.g., 100 nm or 150 nm) is grown on the aluminum nitride substrate by using a chemical vapor deposition method, to obtain a low V-III ratio gallium nitride substrate. The flow rate of gallium source is 10-200 μmol/min (e.g., 120 μmol/min or 150 μmol/min); and the flow rate of ammonia gas is 1000-10000 sccm (e.g., 2000 sccm or 3000 sccm).

Step 6. Growing a High V-III Ratio GaN Layer.

The temperature of the reaction chamber is maintained at 1000° C.; the pressure is increased to 40 Torr; and hydrogen gas, ammonia gas and gallium source are sequentially introduced therein; then, under the atmosphere of hydrogen gas, ammonia gas and gallium source, a GaN epitaxial layer having a thickness of 500 to 3000 nm (e.g., 1200 nm or 1500 nm) is grown on the low V-III ratio GaN substrate, by using a chemical vapor deposition method. The flow rate of gallium source is 10-200 μmol/min (e.g., 120 μmol/min or 150 μmol/min); the flow rate of ammonia gas is 1000-10000 sccm (e.g., 5000 sccm); finally, the temperature of the reaction chamber is lowered to room temperature; and then the sample is taken out, to obtain a c-plane gallium nitride (such as Ga-face gallium nitride or N-face gallium nitride).

The order of the above steps 5 and 6 may be reversed.

Figure 4:
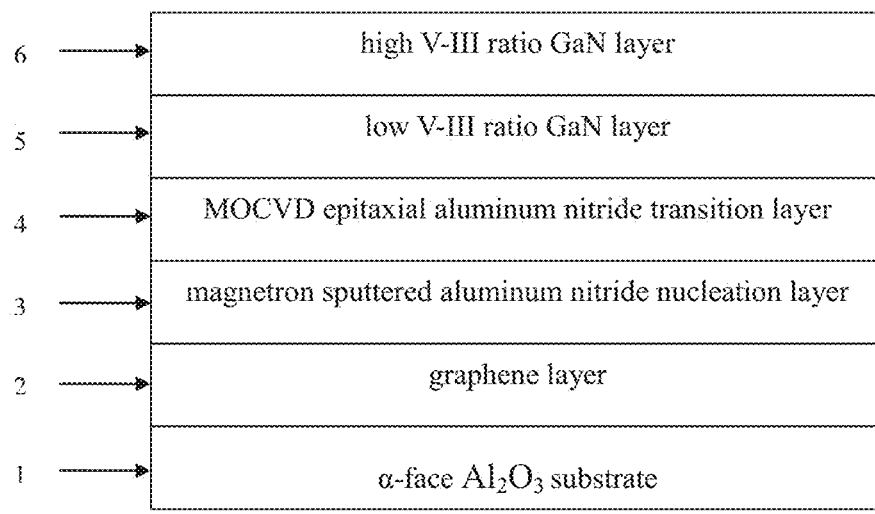
FIG. 4 is a schematic cross-sectional structural view of the gallium nitride fabricated by the method of the second embodiment.

FIG. 4 shows a cross-sectional structure of the GaN based on graphene and magnetron sputtered aluminum nitride, which is fabricated by using the above method of this embodiment. In the GaN, in order from bottom to top, a sapphire substrate layer 1, a graphene layer 2, and a magnetron sputtered aluminum nitride nucleation layer 3, an aluminum nitride transition layer 4, a low V-III ratio GaN layer 5 and a high V-III GaN layer 6 are formed. In another optional structure, in order from bottom to top, a sapphire substrate layer, a graphene layer, a magnetron sputtered aluminum nitride nucleation layer, an aluminum nitride transition layer, a high V-III ratio GaN layer, and a low V-III ratio GaN layer are formed.

Third Embodiment

In the method of the third embodiment, firstly, a layer of graphene is grown on a copper substrate; then, a layer of aluminum nitride film is magnetron sputtered, which is used for alleviating the stress caused by lattice mismatch between the substrate and the gallium nitride; finally, the sample is placed in MOCVD reaction chamber; and, sequentially, an aluminum nitride transition layer, a low V-III ratio GaN epitaxial layer and a high V-III ratio GaN epitaxial layer are epitaxially grown. The quality of gallium nitride can be further improved by adjusting the pressure, flow rate, temperature, and thickness growth conditions during growth of each layer.

Figure 5:
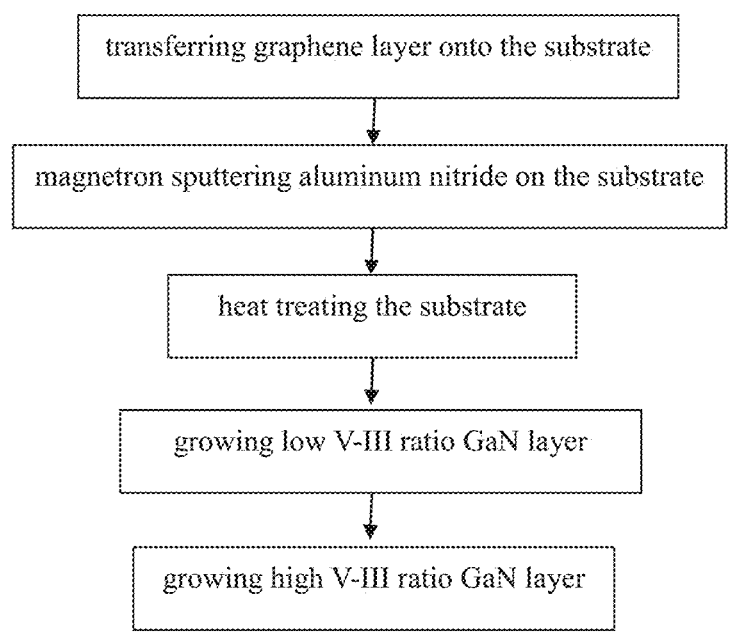
FIG. 5 is a flow chart of a method for fabricating a gallium nitride having a copper substrate, in accordance with a third embodiment of the present invention.

Referring to FIG. 5, the method of this embodiment includes the follow steps:

Step 1: Growing Graphene.

Firstly, a cleaned copper foil is placed in a tubular furnace quartz tube; the tubular furnace quartz is vacuumized for 10 minutes; then, hydrogen gas is introduced therein; the tube furnace is heated to 1000° C. and annealed for 2 hours; finally, carbon source gas is introduced therein for growth. After 2 hours, the carbon source is closed; and the temperature of the tube furnace quartz tube is quickly lowered to room temperature, to obtain the copper substrate on which graphene is grown.

Step 2: Magnetron Sputtering Aluminum Nitride.

The graphene-coated copper substrate is placed in a magnetron sputtering system; the pressure of the reaction chamber is 1 Pa; and nitrogen gas and argon gas are introduced for 5 minutes. With 5N purity aluminum as the target material, an aluminum nitride film with a thickness of 30-100 nm (e.g., 30 nm) is sputtered on the graphene-coated copper substrate by using RF magnetron sputtering technology, to obtain a substrate sputtered with aluminum nitride. The flow rate of the ammonia gas is 1000 sccm; and the flow rate of the aluminum source is 5 to 100 μmol/min.

Similar to the first and second embodiments, the above-stated step of magnetron sputtering aluminum nitride causes the embodiment to have the advantage that the nitride material is easily nucleated on the graphene, and the temperature required for the magnetron sputtering method is very low, so as to avoid thermal decomposition of graphene at high temperatures. Moreover, this embodiment uses the magnetron sputtering technique to grow aluminum nitride, so as to overcome the deficiency of prior art that the temperature of the subsequently grown nitride material cannot be higher than the melting point of the copper and the quality of the nitride material is accordingly affected, and to cause the method of this embodiment to have the advantage that the upper limit of the growth temperature of the nitride material is low. Further, the method of the third embodiment can overcome the deficiency of prior art that the nitride material can only be grown on a substrate with small lattice mismatch, and has the advantage that GaN can be grown on a substrate with large lattice mismatch.

Step 3: Heat Treating.

The substrate sputtered with aluminum nitride is placed in an MOCVD reaction chamber; and a mixed gas of hydrogen gas and ammonia gas is introduced into the reaction chamber for 5 minutes; after a mixed gas of hydrogen gas and ammonia gas is introduced for 5 minutes, the reaction chamber is heated to 600° C.; the substrate sputtered with aluminum nitride is subjected to heat treatment for 20 minutes, to obtain a heat-treated substrate.

Step 4: Growing a Low V-III Ratio GaN Layer.

The pressure in the reaction chamber is reduced to 20 Torr; the temperature is lowered to 1000° C., and hydrogen gas, ammonia gas and gallium source are sequentially introduced. Under the atmosphere of hydrogen gas, ammonia gas and gallium source, a gallium nitride epitaxial layer having a thickness of 50-200 nm (e.g., 100 nm) is grown on the substrate sputtered with aluminum nitride by using chemical vapor deposition method, to obtain a low V-III ratio GaN substrate. The flow rate of gallium source is 10-200 μmol/min (e.g., 120 μmol/min); and the flow rate of ammonia gas is 1000-3500 sccm (e.g., 3000 sccm).

Step 5: Growing a High V-III Ratio GaN Layer.

The temperature of the reaction chamber is maintained at 1000° C.; the pressure therein is increased to 40 Torr and then hydrogen gas, ammonia gas and gallium source are sequentially introduced. Under the atmosphere of hydrogen gas, ammonia gas and gallium source, a gallium nitride epitaxial layer having a thickness of 500-3000 nm (e.g., 1500 nm) is grown on the low V-III ratio GaN substrate, by using chemical vapor deposition method. The flow rate of gallium source is 10-200 μmol/min (e.g., 120 μmol/min); and the flow rate of ammonia gas is 4000-10000 sccm (e.g., 5000 sccm). Then, the temperature of the reaction chamber is lowered to room temperature; and the sample is taken out, to obtain c-plane gallium nitride.

The order of the above steps 4 and 5 may be reversed. A step of growing the aluminum nitride transition layer may also be provided between the above steps 3 and 4, to further improve the quality of the obtained gallium nitride film. In the step of growing the aluminum nitride transition layer, firstly, the pressure of the reaction chamber pressure is maintained at 40 Torr; the temperature is raised to 650° C.; hydrogen gas, ammonia gas and aluminum source are sequentially introduced; and an aluminum nitride buffer layer is grown at low temperature. Under the atmosphere of hydrogen gas, ammonia gas and aluminum source, the temperature is increased to 1050° C., an aluminum nitride transition layer with thickness of 200 nm is grown by using pulsed MOCVD method, to obtain an aluminum nitride substrate. The flow rate of the aluminum source is 10 μmol/min; and the flow rate of the ammonia gas is 1000 sccm.

Figure 6:
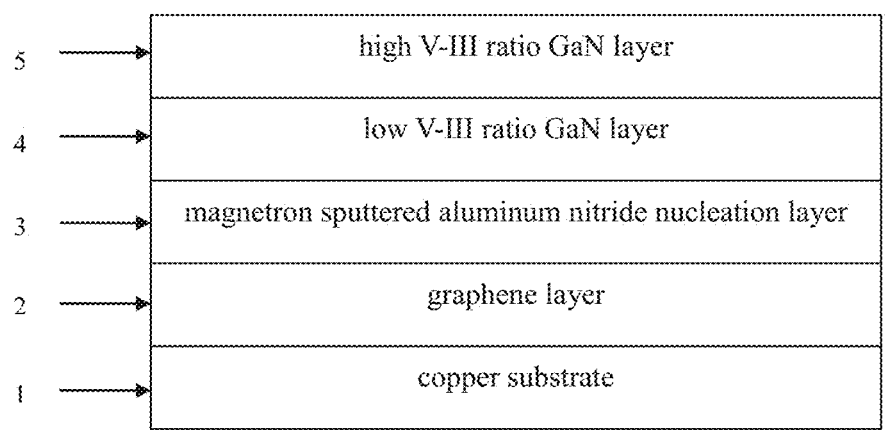
FIG. 6 is a schematic cross-sectional structural view of the gallium nitride fabricated by the method of the third embodiment.

FIG. 6 shows a cross-sectional structure view of the gallium nitride based on graphene and magnetron sputtered aluminum nitride, which is fabricated by the above method of the embodiment. In the shown gallium nitride, in order from bottom to top, a copper substrate layer 1, a graphene layer 2, and a magnetron sputtered aluminum nitride nucleation layer 3, a low V-III ratio GaN layer 4 and a high V-III ratio GaN layer 5 are formed. In another optional structure, in order from bottom to top, a copper substrate layer, a graphene layer, a magnetron sputtered aluminum nitride nucleation layer, a high V-III ratio GaN layer and a low V-III ratio GaN layer are formed.

In a variation of this embodiment, an aluminum nitride transition layer may be grown between the aluminum nitride nucleation layer and an adjacent low V-III ratio GaN layer or high V-III ratio GaN layer.

The invention claimed is:
1. A method for growing gallium nitride, comprising:
spreading graphene over a substrate;

magnetron sputtering an aluminum nitride onto the graphene-coated substrate, to obtain a substrate sputtered with aluminum nitride;

placing the substrate sputtered with aluminum nitride in a metal organic chemical vapor deposition (MOCVD) reaction chamber and heat treating the substrate to obtain the heat-treated substrate;

growing an aluminum nitride transition layer on the heat-treated substrate; and growing a first gallium nitride layer and a second gallium nitride layer on the heat-treated substrate, respectively;

wherein V-III ratio of the first gallium nitride layer is different from V-III ratio of the second gallium nitride layer;

wherein the step of magnetron sputtering an aluminum nitride on the substrate comprises:

placing the graphene-coated silicon substrate into a magnetron sputtering system; and introducing nitrogen gas and argon gas into the reaction chamber of the magnetron sputtering system; and with 5N purity aluminum as target material, sputtering an aluminum nitride on the graphene-coated substrate by radio frequency (RF) magnetron sputtering, to obtain the substrate sputtered with aluminum nitride;

wherein the step of growing the aluminum nitride transition layer comprises:

sequentially introducing hydrogen gas, ammonia gas and aluminum source in the MOCVD reaction chamber, and growing the aluminum nitride buffer layer at low temperature;

under an atmosphere of hydrogen gas, ammonia gas and aluminum source, heating the reaction chamber, and growing the aluminum nitride transition layer by using a pulsed MOCVD growth process, to obtain an aluminum nitride substrate;

wherein the pulsed MOCVD growth process comprises: in one pulse period T1+T2 of growing aluminum nitride, introducing ammonia gas in T1 time; not introducing ammonia gas in T2 time; and repeating multiple pulse periods; wherein, the flow rate of aluminum source is 5-100 μmol/min, and the flow rate of ammonia gas is 100-5000 sccm.

2. The method of claim 1, wherein the substrate is any of a silicon substrate.

3. The method according to claim 1, wherein the substrate is a first substrate; and the step of spreading graphene over the substrate comprises:

growing a single layer of graphene on a second metal substrate; and
removing the second metal substrate; and
transferring the single layer of graphene onto said first substrate to obtain the graphene-coated substrate.

4. The method according to claim 1, wherein the aluminum nitride transition layer has a thickness of 5 to 50 nm.

5. The method according to claim 1, wherein the V-III ratio of the first gallium nitride layer is lower than the V-III ratio of the second gallium nitride layer; and the step of growing the first gallium nitride layer comprises:

reducing the pressure in the MOCVD reaction chamber to 20 Torr; reducing the temperature to 1000° C.; and sequentially introducing hydrogen gas, ammonia gas and gallium source into the reaction chamber;

under the atmosphere of hydrogen gas, ammonia gas and the gallium source, growing, on the aluminum nitride substrate, a low V-III ratio gallium nitride epitaxial layer by using chemical vapor deposition method, and then obtaining a low V-III ratio gallium nitride substrate.

6. The method according to claim 5, wherein the low V-III ratio gallium nitride epitaxial layer has a thickness of 50 to 200 nm;

wherein the flow rate of ammonia gas is 1000 to 10000 sccm; and the flow rate of gallium source is 10 to 200 μmol/min.

7. The method according to claim 1, wherein the V-III ratio of the first gallium nitride layer is lower than the V-III ratio of the second gallium nitride layer; and the step of growing the second gallium nitride layer comprises:

maintaining the temperature of the MOCVD reaction chamber at 1000° C.; increasing the pressure in the reaction chamber to 40 Torr; sequentially introducing hydrogen gas, ammonia gas and gallium source into the reaction chamber;

under the atmosphere of hydrogen gas, ammonia gas and gallium source, growing a high-V-III ratio gallium nitride epitaxial layer on the low V-III ratio gallium nitride substrate by using chemical vapor deposition method; and reducing the temperature of the reaction chamber to room temperature; and then taking out the sample, to obtain a silicon-based gallium nitride based on graphene and magnetron sputtered aluminum nitride.

8. The method according to claim 7, wherein the high V-III ratio gallium nitride epitaxial layer has a thickness of 500 to 3000 nm;

wherein the flow rate of ammonia gas is 1000 to 10000 sccm; and the flow rate of gallium source is 10 to 200 μmol/min.

9. The method according to claim 1, wherein the graphene spread on the substrate has a thickness of 0.34 nm to 34 nm or 1 to 100 carbon atom layers.

10. The method of claim 1 wherein the thickness of the magnetron sputtered aluminum nitride on the substrate is 30 to 100 nm.

11. The method according to claim 3, wherein during the radio frequency magnetron sputtering, the flow rate of ammonia gas is 1000 sccm, and the flow rate of aluminum source is 5 to 100 μmol/min.

12. The method according to claim 1, wherein the step of heat treating comprises:

after placing the substrate sputtered with aluminum nitride in the MOCVD reaction chamber, introducing a mixed gas of hydrogen gas and ammonia gas into the reaction chamber; and after introducing the mixed gas of hydrogen gas and ammonia gas, heating the reaction chamber, and heat treating the substrate sputtered with the aluminum nitride, to obtain the heat-treated substrate.

13. The method of claim 1 wherein the V-III ratio of the first gallium nitride layer is lower than the V-III ratio of the second gallium nitride layer; the step of growing the first gallium nitride layer and the second gallium nitride layer comprises:

growing the first gallium nitride layer; and then growing the second gallium nitride layer on the substrate on which a low V-III ratio gallium nitride layer is grown; or growing the second long gallium nitride layer; and then growing the first gallium nitride layer on the substrate on which a high V-III ratio gallium nitride layer is grown.

14. A gallium nitride film, comprising the following structures in order from bottom to top: a substrate, a graphene layer, an aluminum nitride nucleation layer formed by a magnetron sputtering method, a first gallium nitride layer, and a second gallium nitride layer; wherein V-III ratio of the first gallium nitride layer is different from V-III ratio of the second gallium nitride layer;

wherein the gallium nitride film further comprises an aluminum nitride transition layer located between the aluminum nitride nucleation layer and the first gallium nitride layer.

15. The gallium nitride film according to claim 14, wherein the substrate is a silicon substrate.

\* \* \* \* \*